United States Patent
Ikeda (10) Patent No.: US 9,300,223 B2
(45) Date of Patent: Mar. 29, 2016

(54) RECTIFYING CIRCUIT AND SEMICONDUCTOR DEVICE

(71) Applicant: Kabushiki Kaisha Toshiba, Minato-ku (JP)

(72) Inventor: Kentaro Ikeda, Kanagawa-ken (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 192 days.

(21) Appl. No.: 13/927,611

(22) Filed: Jun. 26, 2013

(65) Prior Publication Data

US 2014/0098585 A1 Apr. 10, 2014

(30) Foreign Application Priority Data

Oct. 9, 2012 (JP) .................. 2012-224569

(51) Int. Cl.
| | |
|---|---|
| *H02M 7/06* | (2006.01) |
| *H02M 7/04* | (2006.01) |
| *H01L 27/06* | (2006.01) |
| *H01L 27/08* | (2006.01) |

(52) U.S. Cl.
CPC ............. *H02M 7/04* (2013.01); *H01L 27/0605* (2013.01); *H01L 27/0629* (2013.01); *H01L 27/0817* (2013.01); *H01L 2224/48091* (2013.01); *H01L 2224/73265* (2013.01); *H01L 2924/12032* (2013.01); *H01L 2924/19105* (2013.01); *H01L 2924/19107* (2013.01)

(58) Field of Classification Search
USPC ............... 363/125–127; 361/91.1, 91.5, 91.6, 361/91.7; 323/223, 273, 274
See application file for complete search history.

(56) References Cited

U.S. PATENT DOCUMENTS

| | | | | |
|---|---|---|---|---|
| 3,940,683 | A * | 2/1976 | Blauschild .................... | 323/311 |
| 4,717,867 | A * | 1/1988 | Forehand ...................... | 323/223 |
| 6,487,100 | B2 * | 11/2002 | Watanabe .......... | G06K 19/0723 363/127 |
| 7,889,528 | B2 * | 2/2011 | Shionoiri ............ | H01L 27/0629 363/125 |
| 2008/0203433 | A1 * | 8/2008 | Sato .............................. | 257/192 |
| 2012/0099355 | A1 * | 4/2012 | Xie et al. ...................... | 363/126 |
| 2012/0268849 | A1 * | 10/2012 | Tomatsu ......................... | 361/56 |
| 2013/0076322 | A1 * | 3/2013 | Tateno et al. ................. | 323/271 |
| 2014/0016386 | A1 * | 1/2014 | Weis ..................... | H02M 7/217 363/126 |

FOREIGN PATENT DOCUMENTS

JP 2008-198735 8/2008

* cited by examiner

*Primary Examiner* — Nguyen Tran
(74) *Attorney, Agent, or Firm* — Oblon, McClelland, Maier & Neustadt, L.L.P.

(57) ABSTRACT

According to one embodiment, a rectifying circuit includes a transistor, a rectifying element and a resistor. The transistor includes a control electrode, a first electrode and a second electrode. The rectifying element includes an anode electrode and a cathode electrode. The cathode electrode is electrically connected to the first electrode. The resistor includes one end and one other end. The One end of the resistor is electrically connected to the control electrode. The one other end of the resistor is electrically connected to the anode electrode.

15 Claims, 9 Drawing Sheets

RECTIFYING CIRCUIT AND SEMICONDUCTOR DEVICE

CROSS-REFERENCE TO RELATED APPLICATIONS

This application is based upon and claims the benefit of priority from Japanese Patent Application No. 2012-224569, filed on Oct. 9, 2012; the entire contents of which are incorporated herein by reference.

FIELD

Embodiments described herein relate generally to a rectifying circuit and semiconductor device.

BACKGROUND

A semiconductor device using a so-called wide-gap semiconductor such as gallium nitride (GaN), silicon carbide (SiC), diamond, zinc oxide (ZnO), etc., can have a high breakdown voltage, a low on-resistance, and a high-speed operation compared to a semiconductor device using silicon (Si).

For a Schottky barrier diode which has low recovery characteristics, a higher on-voltage is observed when the diode is formed of, for example, GaN than when formed of Si.

It is important to improve the characteristics of the semiconductor device such as the breakdown voltage, the on-resistance, the leak current, the on-voltage, the recoverability, etc.

DETAILED DESCRIPTION

In general, according to one embodiment, a rectifying circuit includes a transistor, a rectifying element and a resistor. The transistor includes a control electrode, a first electrode and a second electrode. The rectifying element includes an anode electrode and a cathode electrode. The cathode electrode is electrically connected to the first electrode. The resistor includes one end and one other end. The One end of the resistor is electrically connected to the control electrode. The one other end of the resistor is electrically connected to the anode electrode.

Various embodiments will be described hereinafter with reference to the accompanying drawings.

In the description hereinbelow, similar members are marked with like reference numerals, and a description is omitted as appropriate for members once described.

First Embodiment

Figure 1:
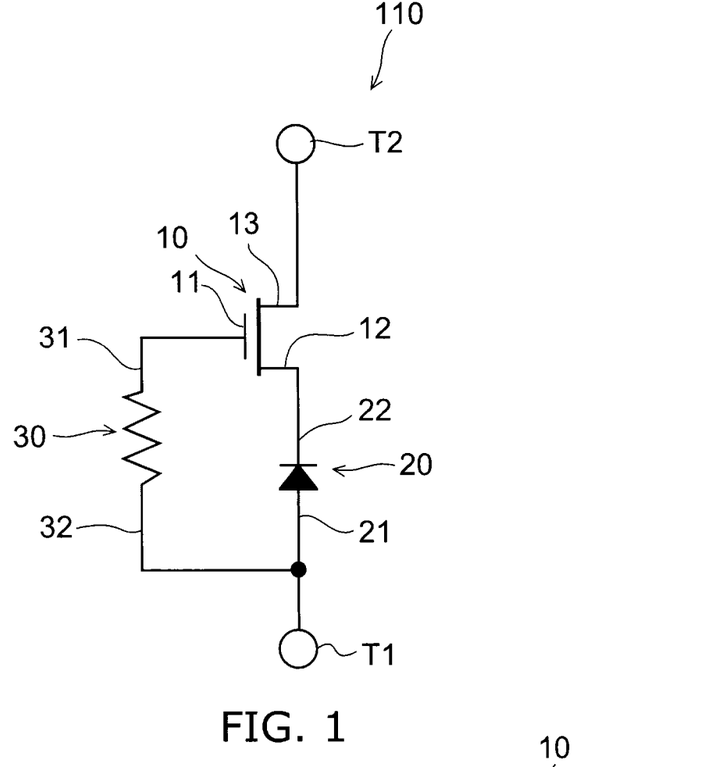
FIG. 1 is a circuit diagram showing the configuration of a rectifying circuit according to a first embodiment.

FIG. 1 is a circuit diagram showing the configuration of a rectifying circuit according to a first embodiment.

As shown in FIG. 1, the rectifying circuit 110 according to the first embodiment includes a first terminal T1, a second terminal T2, a transistor 10, a diode (a rectifying element) 20, and a resistor 30. The rectifying circuit 110 is a two-terminal element in which the transistor 10, the diode 20, and the resistor 30 are combined.

The transistor 10 includes a gate electrode (a control electrode) 11, a source electrode (a first electrode) 12, and a drain electrode (a second electrode) 13. In the embodiment, the transistor 10 is, for example, a FET (field effect transistor). In the transistor 10, the first electrode may be the drain electrode; and the second electrode may be the source electrode. In the description of the embodiment, the first electrode is the source electrode 12; and the second electrode is the drain electrode 13.

The transistor 10 includes, for example, a nitride semiconductor. In the embodiment, the transistor 10 includes GaN as the nitride semiconductor. The transistor 10 is a normally-on FET including GaN.

Figure 2:
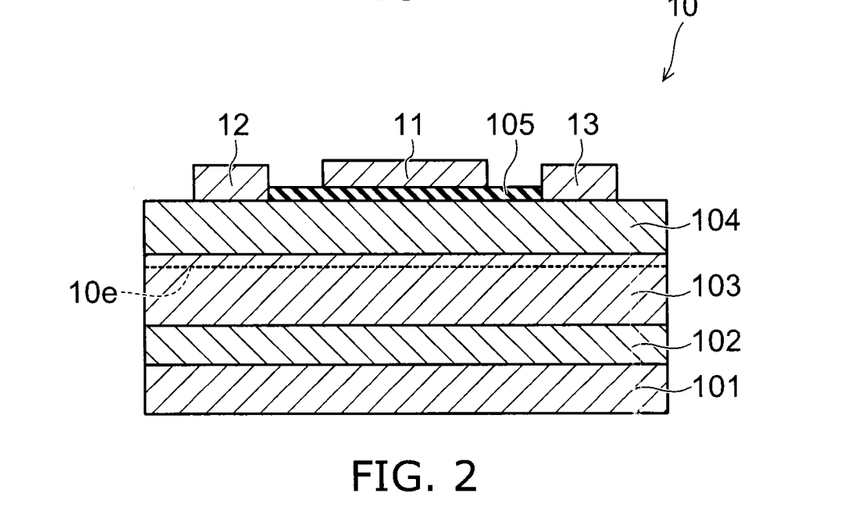
FIG. 2 is a schematic cross-sectional view showing the configuration of the transistor.

FIG. 2 is a schematic cross-sectional view showing the configuration of the transistor.

The transistor 10 includes a substrate 101, a buffer layer 102 provided on the substrate 101, a GaN-containing layer (a first nitride semiconductor layer) 103 provided on the buffer layer 102, and a barrier layer (a second nitride semiconductor layer) 104 that is provided on the GaN-containing layer 103 and has a heterojunction with the GaN-containing layer 103. The gate electrode 11, the source electrode 12, and the drain electrode 13 are provided on the barrier layer 104. The gate electrode 11 is provided on the barrier layer 104 with a gate insulating film 105 interposed.

In the transistor 10, a two-dimensional electron gas (2DEG) 10e occurs in the GaN-containing layer 103 proximal to the interface between the GaN-containing layer 103 and the barrier layer 104. The two-dimensional electron gas 10e has high electron mobility and a high electron density. The GaN-containing layer 103 functions as a carrier transport layer.

The gate electrode 11 controls the current flowing between the source electrode 12 and the drain electrode 13. The source electrode 12 has an ohmic contact with the barrier layer 104. The drain electrode 13 has an ohmic contact with the barrier layer 104.

The substrate 101 is, for example, one selected from a Si substrate, a SiC substrate, and a sapphire substrate. The buffer layer 102 includes, for example, one selected from GaN and AlGaN. The barrier layer 104 includes $Al_xGa_{1-x}N$ ($0<X\le1$) or $In_YAl_{1-Y}N$ ($0<Y\le1$) that is non-doped or the n type.

The material of the gate insulating film 105 is one selected from a silicon nitride film ($Si_3N_4$), a silicon oxide film ($SiO_2$), and aluminum oxide ($Al_2O_3$). The gate electrode 11 may have a MIS (Metal-Insulator-Semiconductor) structure such as that shown in the drawing or may be a material having a Schottky junction with the barrier layer 104 without the gate insulating film 105 being interposed. The source electrode 12 and the drain electrode 13 include Ti, Al, etc.

The diode 20 is, for example, a Schottky barrier diode including Si. The diode 20 may be a pin junction diode or a pn junction diode. In the embodiment, an example is described in which a Schottky barrier diode having a low on-voltage and a short recovery time (reverse recovery time) is used as the diode 20.

Operations of the rectifying circuit 110 will now be described.

First, the operation when a forward bias is applied to the rectifying circuit 110 will be described.

When a voltage that is higher than that of the second terminal T2 (a voltage that is not less than the on-voltage of the diode 20) is applied to the first terminal T1, the diode 20 is switched to a forward bias state. At this time, a positive potential is applied to the gate electrode 11 of the transistor 10. The threshold voltage of the transistor 10 is lower than the on-voltage of the diode 20 (e.g., is normally on). Therefore, the transistor 10 is in the on-state when the voltage that is not less than the on-voltage of the diode 20 is applied to the gate electrode 11. Thereby, a current flows in the transistor 10 from the diode 20. In other words, for the forward bias, the rectifying circuit 110 operates at an on-voltage that is equivalent to the on-voltage of the diode 20.

The operation when a reverse bias is applied to the rectifying circuit 110 will now be described.

The diode 20 is switched to a reverse bias state when a voltage that is lower than that of the second terminal T2 (a voltage less than the on-voltage of the diode 20) is applied to the first terminal T1. Thereby, the voltage of the gate electrode 11 decreases as the voltage of the diode 20 increases. The transistor 10 is switched to the off-state when the voltage of the gate electrode 11 falls below the threshold. Thereby, the current that was flowing in the transistor 10 from the diode 20 is broken. The voltage applied to the diode 20 does not increase after the transistor 10 is switched to the off-state. Accordingly, the transistor 10 bears the majority of the breakdown voltage of the rectifying circuit 110. In other words, for the reverse bias, the rectifying circuit 110 has a breakdown voltage that is equivalent to the breakdown voltage of the transistor 10.

Thus, the rectifying circuit 110 has an on-voltage that is equivalent to that of the diode 20 for the forward bias and a breakdown voltage that is equivalent to that of the transistor 10 for the reverse bias. Accordingly, it is sufficient for the breakdown voltage of the diode 20 to be higher than the absolute value of the threshold voltage of the transistor 10; and the breakdown voltage of the diode 20 may be lower than the breakdown voltage of the transistor 10. On the other hand, it is sufficient for the breakdown voltage of the transistor 10 to be higher than the absolute value of the voltage applied to the diode 20 when the reverse bias is applied to the diode 20.

When a signal of a prescribed frequency is input to the first terminal T1 of such a rectifying circuit 110, a rectified signal is output from the second terminal T2. Because the resistor 30 is provided between the gate electrode 11 and an anode electrode 21 in the rectifying circuit 110 according to the embodiment, the oscillation of the signal output from the second terminal T2 when the signal of the prescribed frequency is input to the first terminal T1 is suppressed.

The oscillation of the signal will now be described.

Figure 3A:
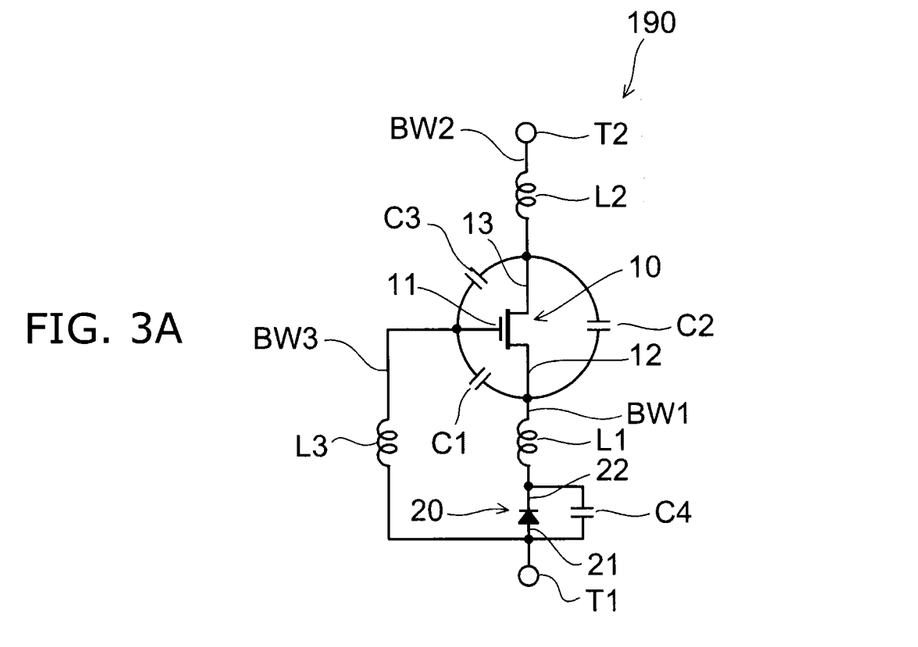
FIGS. 3A and 3B are equivalent circuit diagrams of rectifying circuits.
Figure 3B:
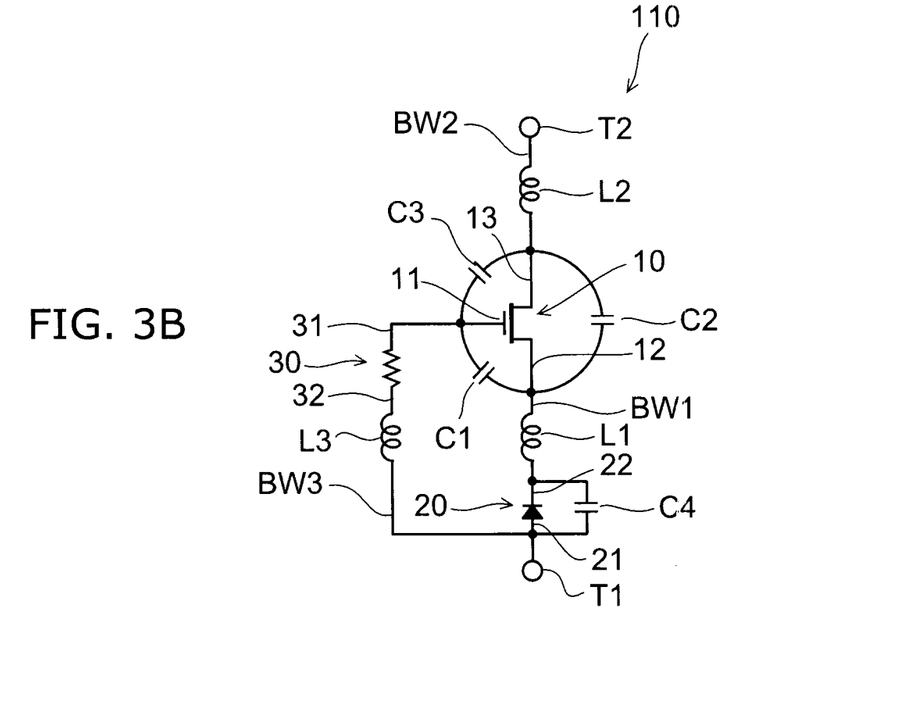

FIGS. 3A and 3B are equivalent circuit diagrams of rectifying circuits.

FIG. 3A shows an equivalent circuit diagram of a rectifying circuit 190 according to a reference example. FIG. 3B shows an equivalent circuit diagram of the rectifying circuit 110 according to the embodiment.

Figure 4A:
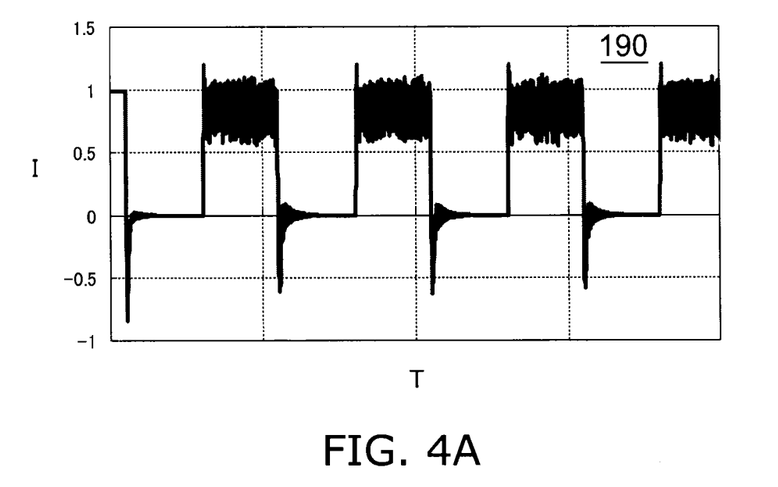
FIGS. 4A and 4B show output signals of the rectifying circuits.
Figure 4B:
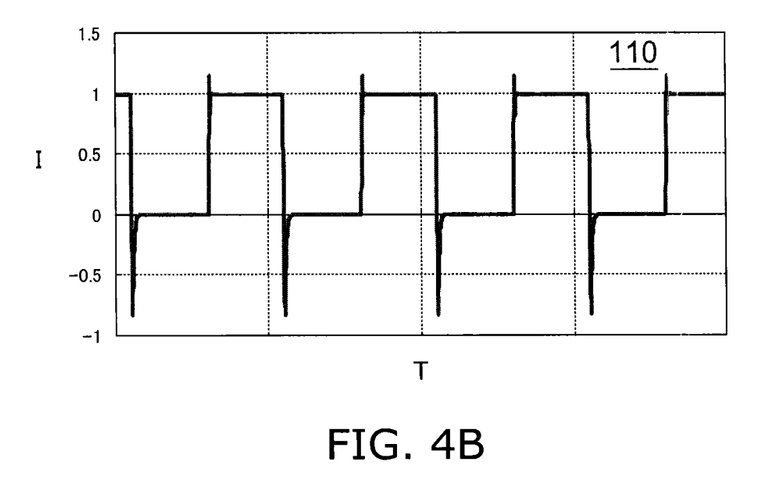

FIGS. 4A and 4B show output signals of the rectifying circuits.

FIG. 4A shows an example of the output signal of the rectifying circuit 190 according to the reference example. FIG. 4B shows an example of the output signal of the rectifying circuit 110 according to the embodiment.

As shown in FIG. 3A, the rectifying circuit 190 according to the reference example includes the transistor 10 and the diode 20. In the rectifying circuit 190, the source electrode 12 of the transistor 10 is connected to a cathode electrode 22 of the diode 20. In the rectifying circuit 190, the gate electrode 11 of the transistor 10 is connected to the anode electrode 21 of the diode 20.

The source electrode 12 is connected to the cathode electrode 22 via a bonding wire BW1. The drain electrode 13 is connected to the second terminal T2 via a bonding wire BW2. The gate electrode 11 is connected to the anode electrode 21 via a bonding wire BW3.

Such a rectifying circuit 190 has parasitic capacitances C1 to C4 and parasitic inductances L1 to L3. The parasitic capacitance C1 is the capacitance between the gate electrode 11 and the source electrode 12 of the transistor 10. The parasitic capacitance C2 is the capacitance between the source electrode 12 and the drain electrode 13 of the transistor 10. The parasitic capacitance C3 is the capacitance between the gate electrode 11 and the drain electrode 13 of the transistor 10. The parasitic capacitance C4 is the capacitance included in the diode 20. The parasitic inductances L1 to L3 are the inductances included in the bonding wires BW1 to BW3, respectively.

The rectifying circuit 190 has an LC resonant circuit made of the parasitic capacitances C1 to C4 and the parasitic inductances L1 to L3 included in the rectifying circuit 190. Thereby, there is a possibility that a parasitic oscillation may occur in the rectifying circuit 190.

FIGS. 4A and 4B show the results of a simulation that calculates the change of the output (the current) when a signal of a prescribed frequency is input to the rectifying circuit. In these graphs, the horizontal axis is time T; and the vertical axis is a current I. In the rectifying circuit 190 as shown in FIG. 4A, a parasitic oscillation occurs due to the LC resonant circuit recited above; and the waveform is greatly disturbed in both the on-state and the off-state.

As shown in FIG. 3B, in addition to the transistor 10 and the diode, the resistor 30 is connected between the gate electrode 11 and the anode electrode 21 in the rectifying circuit 110 of the embodiment.

Similarly to the rectifying circuit 190 according to the reference example, such a rectifying circuit 110 also has the parasitic capacitances C1 to C4 and the parasitic inductances L1 to L3. However, in the rectifying circuit 110 according to the embodiment, the resistor 30 provided between the gate electrode 11 and the anode electrode 21 functions to suppress the resonation of the LC resonant circuit. Suppressing the resonation improves the characteristics of the rectifying circuit 110 such as the recoverability, the breakdown voltage, the on-resistance, the leak current, the on-voltage, etc.

As shown in FIG. 4B, it can be seen that the resonation is suppressed in both the on-state and the off-state of the rectifying circuit 110 according to the embodiment.

The resistance value of the resistor 30 is set to suppress the oscillation of the LC circuit that includes the parasitic capacitances C1 to C4 and the parasitic inductances L1 to L3 included in the rectifying circuit 110. Here, the parasitic capacitances C1 to C4 and the parasitic inductances L1 to L3 included in the rectifying circuit 110 are roughly determined by the rated current of the rectifying circuit 110. Herein, the rated current of the rectifying circuit 110 refers to the maximum current value to guarantee the operation of the rectifying circuit 110 for direct current.

For example, in the case where the rated current of the rectifying circuit 110 is not more than 1 ampere (A), the resistance value of the resistor 30 is, for example, not less than 9 ohms (Ω) and not more than 200Ω.

In the case where the rated current of the rectifying circuit 110 is not less than 1 A and not more than 5 A, the resistance value of the resistor 30 is, for example, not less than 4Ω and not more than 100Ω.

In the case where the rated current of the rectifying circuit 110 is not less than 10 A and not more than 50 A, the resistance value of the resistor 30 is, for example, not less than 1Ω and not more than 10Ω.

When the resistance value of the resistor 30 falls below the lower limits recited above, the oscillation of the rectifying circuit 110 is not suppressed sufficiently. When the resistance value of the resistor 30 exceeds the upper limits recited above, the switching operation of the rectifying circuit 110 is affected.

Another example of the first embodiment will now be described.

Figure 5:
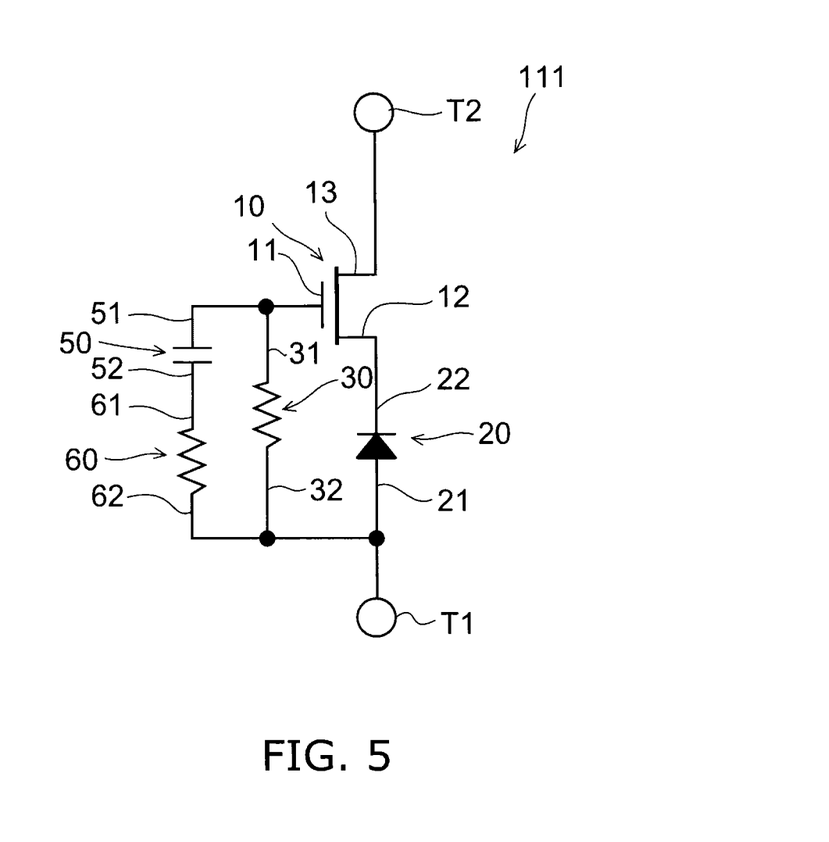
FIG. 5 is a circuit diagram showing the configuration of another example of the rectifying circuit according to the first embodiment.

FIG. 5 is a circuit diagram showing the configuration of another example of the rectifying circuit according to the first embodiment.

FIG. 5 shows the circuit diagram of the rectifying circuit 111 according to the example.

The rectifying circuit 111 shown in FIG. 5 includes a capacitor 50 and a resistor 60 in addition to the first terminal T1, the second terminal T2, the transistor 10, the diode 20, and the resistor 30. The capacitor 50 is connected in parallel with the resistor 30. The capacitor 50 is connected in series with the resistor 60. In other words, one end 51 of the capacitor 50 is connected to the gate electrode 11 and one end 31 of the resistor 30. The other end 52 of the capacitor 50 is connected to one end 61 of the resistor 60. The other end 62 of the resistor 60 is connected to the other end 32 of the resistor 30, the anode electrode 21, and the first terminal T1. In such a rectifying circuit 111, similarly to the rectifying circuit 110, the oscillation is suppressed; the capacitor 50 and the resistor 60 function as a snubber circuit; and a high voltage spike is suppressed when transitioning from the on-state to the off-state. Thereby, the characteristics of the rectifying circuit 111 such as the breakdown voltage, the recoverability, the leak current, the on-resistance, the on-voltage, etc., improve.

Second Embodiment

A second embodiment will now be described.

Figure 6A:
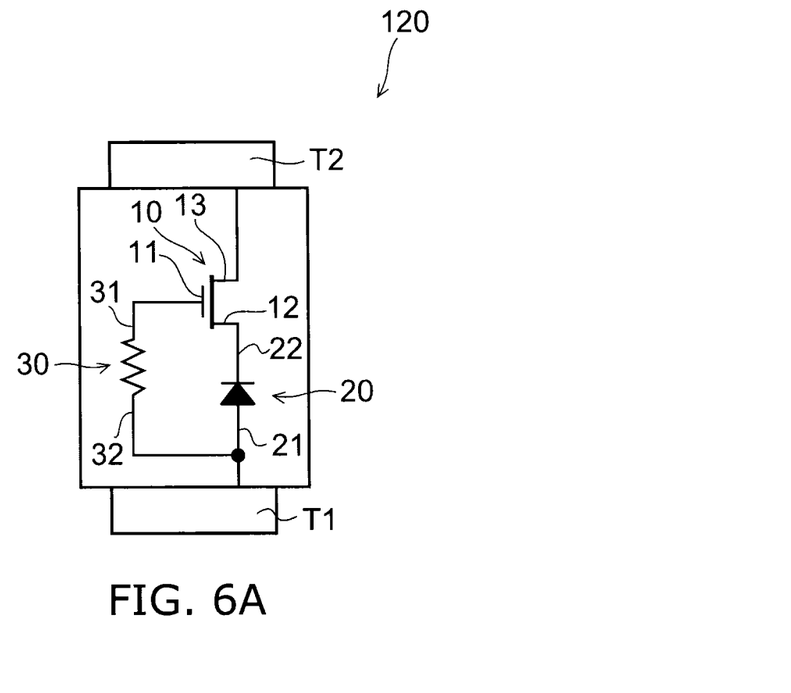
FIGS. 6A and 6B show the configuration of a semiconductor device according to the second embodiment.
Figure 6B:
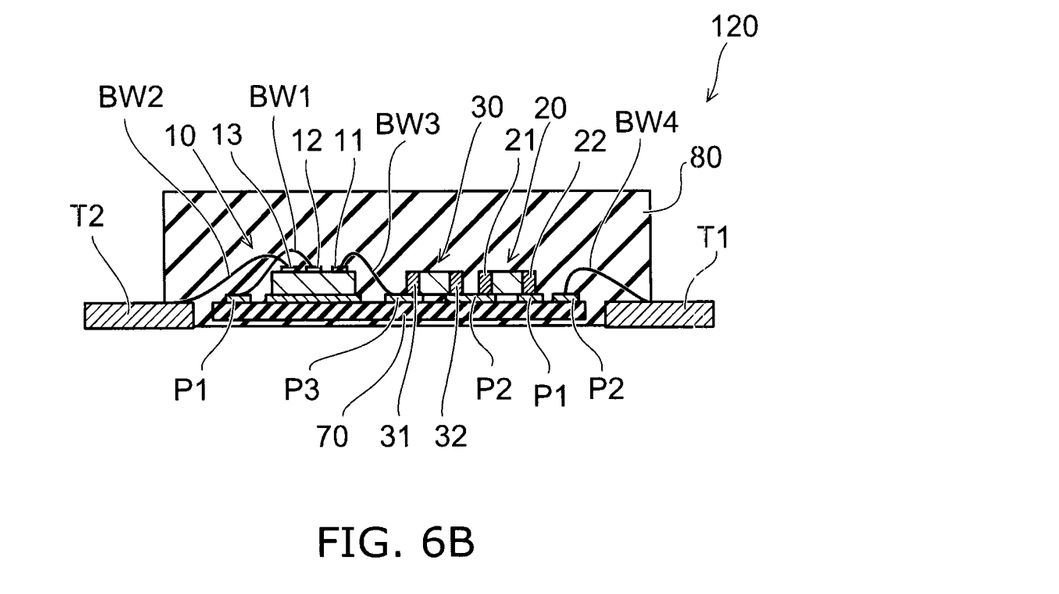

FIGS. 6A and 6B show the configuration of a semiconductor device according to the second embodiment.

FIG. 6A is a schematic plan view of the semiconductor device 120; and FIG. 6B is a schematic cross-sectional view of the semiconductor device 120.

As shown in FIGS. 6A and 6B, the semiconductor device 120 according to the second embodiment includes a mounting substrate 70 in addition to the first terminal T1, the second terminal T2, the transistor 10, the diode 20, and the resistor 30. The semiconductor device 120 shown in FIGS. 6A and 6B further includes a sealing unit 80.

The transistor 10 is cut into a chip configuration after the wafer processes and is mounted to the mounting substrate 70. Also, the diode 20 having a chip configuration and the resistor 30 having a chip configuration are mounted to the mounting substrate 70.

Interconnect patterns P1 to P3 are provided in the mounting substrate 70. The first terminal T1 and the second terminal T2 are disposed to be separated from the mounting substrate 70.

The drain electrode 13 of the transistor 10 is connected to the second terminal T2 via the bonding wire BW2. The source electrode 12 of the transistor 10 is connected to the interconnect pattern P1 via the bonding wire BW1. The gate electrode 11 of the transistor 10 is connected to the interconnect pattern P3 via the bonding wire BW3.

The resistor 30 is connected between the interconnect pattern P3 and the interconnect pattern P2. In other words, the one end 31 of the resistor 30 is connected to the interconnect pattern P3; and the other end 32 of the resistor 30 is connected to the interconnect pattern P2.

The diode 20 is connected between the interconnect pattern P2 and the interconnect pattern P1. In other words, the anode electrode 21 of the diode 20 is connected to the interconnect pattern P2; and the cathode electrode 22 of the diode 20 is connected to the interconnect pattern P1. The interconnect pattern P2 is connected to the first terminal T1 via a bonding wire BW4.

The sealing unit 80 covers the mounting substrate 70, the bonding wires BW1 to BW4, and the transistor 10, the diode 20, and the resistor 30 that are mounted to the mounting substrate 70. The first terminal T1 and the second terminal T2 are exposed to the outside from the side surface of the sealing unit 80.

The semiconductor device 120 is a discrete component in which the two terminals are exposed from the sealing unit 80.

Such a semiconductor device 120 provides a discrete component in which the oscillation of the signal is suppressed by providing the resistor 30 having the chip configuration on the mounting substrate 70. By the oscillation of the signal being suppressed, the characteristics of the semiconductor device 120 such as the breakdown voltage, the recoverability, the leak current, the on-resistance, the on-voltage, etc., improve.

A configuration example of the resistor 30 will now be described.

Figure 7:
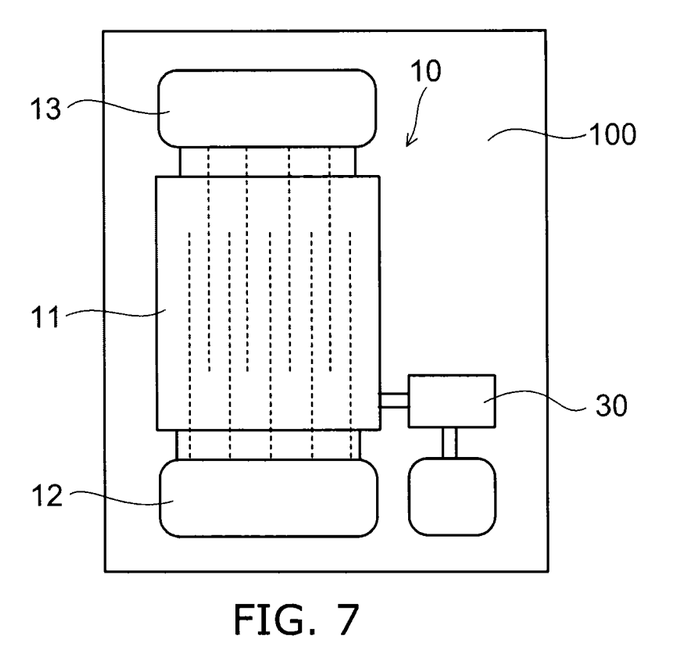
FIG. 7 is a schematic plan view of a transistor.

FIG. 7 is a schematic plan view of a transistor.

The transistor 10 is formed by multiple transistors 10 being formed in a semiconductor wafer and individually cut by a dicing process. The transistor 10 has a size of, for example, about 1 millimeter by 1 millimeter. Multiple transistor structural bodies are provided in the transistor 10; and each of the multiple transistor structural bodies includes a gate portion, a source portion, and a drain portion. Each of the gate portions is electrically connected to the gate electrode 11 provided at the surface of the transistor 10. Each of the source portions is electrically connected to the source electrode 12 provided at the surface of the transistor 10. Each of the drain portions is electrically connected to the drain electrode 13 provided at the surface of the transistor 10.

The resistor 30 shown in FIG. 7 is provided in a semiconductor region 100 where the transistor 10 is formed. In other words, the resistor 30 is provided in one chip in which the transistor 10 is provided, and is provided together with the transistor 10. By the transistor 10 and the resistor 30 being provided in one chip, it is unnecessary for the transistor 10 and the resistor 30 to be mounted to a mounting substrate and connected with bonding wires, etc.

Figure 8:
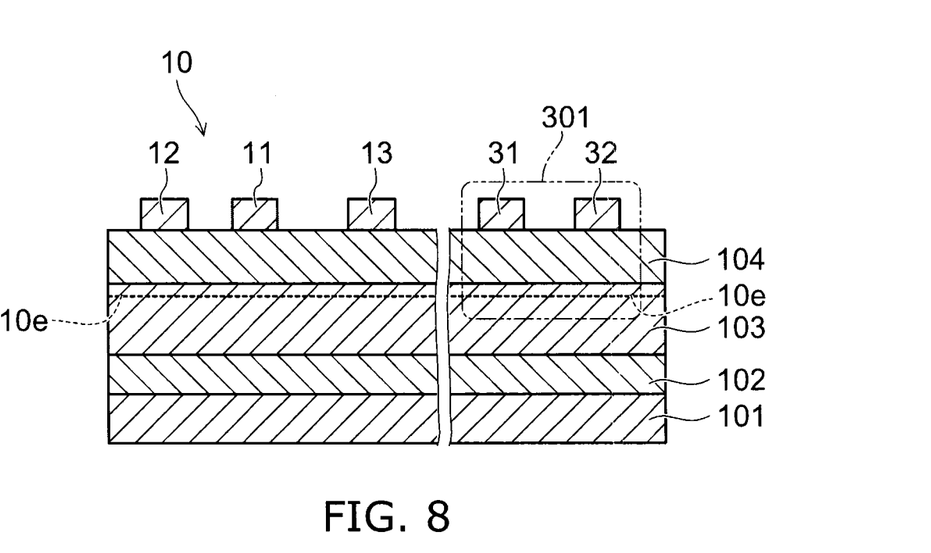
FIG. 8 to FIG. 10 are schematic cross-sectional views showing configurations of resistors.
Figure 9:
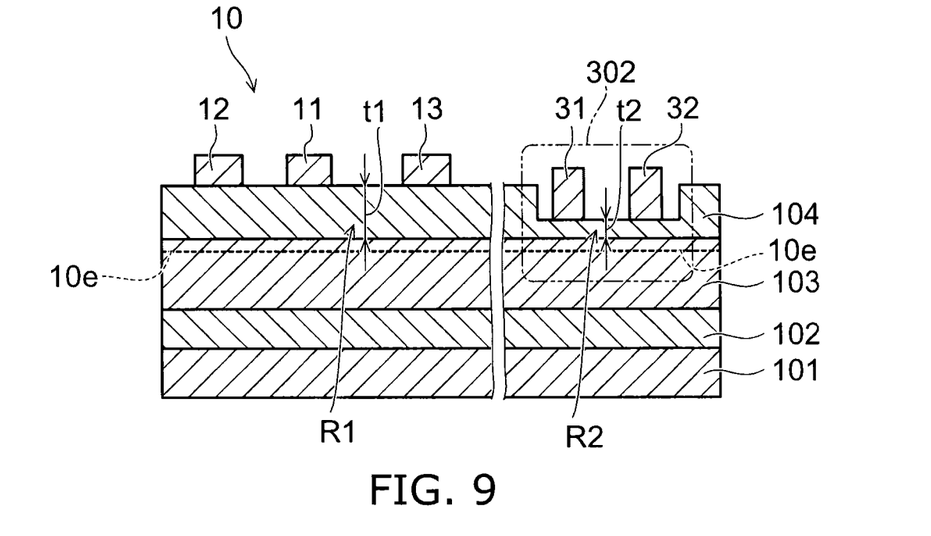
Figure 10:
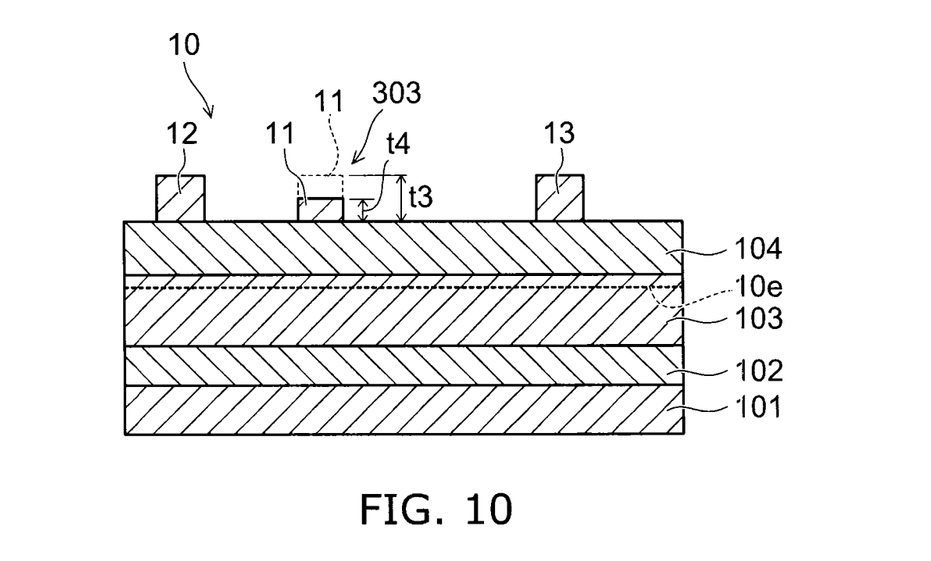

FIG. 8 to FIG. 10 are schematic cross-sectional views showing configurations of resistors.

A resistor 301 shown in FIG. 8 is formed in the GaN-containing layer 103 and the barrier layer 104 that are included in the semiconductor region 100. A terminal T31 that is electrically connected to the one end 31 of the resistor 301 and a terminal T32 that is electrically connected to the other end 32 of the resistor 301 are disposed at a prescribed spacing on the barrier layer 104. The two-dimensional electron gas 10$e$ is formed between the terminals T31 and T32.

The resistor 301 utilizes the electrical resistance of the two-dimensional electron gas 10e. By providing such a resistor 301, the rectifying circuit and the semiconductor device described above are downsized; and the manufacturing processes are simplified.

The resistance value of the resistor 301 may be set by the spacing between the terminals T31 and T32. Also, the resistance value of the resistor 301 may be set by the concentration of the impurity (e.g., Al) implanted into the region of the barrier layer 104 where the resistor 301 is formed. This is because the concentration of the electrons of the two-dimensional electron gas 10e changes and the resistance value changes according to the concentration of the impurity implanted into the barrier layer 104. Also, the resistance value of the resistor 301 may be set by adjusting the contact resistance between the barrier layer 104 and the terminal T31 and the contact resistance between the barrier layer 104 and the terminal T32.

In the configuration example, the resistor 301 is provided in the same chip as the transistor 10 by providing the terminals T31 and T32 on the barrier layer 104.

A resistor 302 shown in FIG. 9 is formed in the GaN-containing layer 103 and the barrier layer 104 that are included in the semiconductor region 100. A thickness t2 of a region (a second portion) of the barrier layer 104 where the resistor 302 is formed is thinner than a thickness t1 of a region (a first portion) of the barrier layer 104 where the transistor 10 is formed. The region of the thickness t2 is formed by carving out a portion of the barrier layer 104 by, for example, ion etching.

The terminal T31 that is electrically connected to the one end 31 of the resistor 302 and the terminal T32 that is electrically connected to the other end 32 of the resistor 302 are disposed at a prescribed spacing on the region of the thickness t2 of the barrier layer 104. The two-dimensional electron gas 10e is formed between the terminals T31 and T32. The resistor 302 utilizes the electrical resistance of the two-dimensional electron gas 10e.

In the case where the spacing between the terminals T31 and T32 is constant, the resistance value of the resistor 302 is set by the thickness t2 of the barrier layer 104. This is because the concentration of the electrons of the two-dimensional electron gas 10e changes and the resistance value changes according to the thickness t2 of the barrier layer 104. Also, the resistance value may be set by damaging the crystal of the region where the resistor 302 is formed in the ion etching process of the barrier layer 104 when the thickness of the barrier layer 104 is changed from the thickness t1 to the thickness t2.

In the configuration example, the resistor 301 is provided in the same chip as the transistor 10 by providing the terminals T31 and T32 in the region where the thickness of the barrier layer 104 is adjusted. By providing such a resistor 302, the rectifying circuit and the semiconductor device described above are downsized; and the manufacturing processes are simplified.

A resistor 303 shown in FIG. 10 is included in the gate electrode 11 of the transistor 10. In other words, the resistor 303 includes the adjustment of a thickness t3 of the gate electrode 11. For example, the resistance value of the gate electrode 11 is increased by reducing the thickness of the gate electrode 11 from t3 to t4. This is utilized such that the gate electrode 11 performs the role of the resistor 303.

In the configuration example, the resistor 303 is provided in the same chip as the transistor 10 by adjusting the thickness of the gate electrode 11. By providing such a resistor 303, the rectifying circuit and the semiconductor device described above are downsized; and the manufacturing processes are simplified.

As a configuration example of the resistor 30, other than the examples described above, a portion of the interconnect (e.g., the metal interconnect) connecting the gate electrode 11 and the anode electrode 21 may be utilized as the resistor 30. In such a case, the resistance value of the resistor 30 is set by at least one selected from the length, the diameter, and the material of the portion of the interconnect.

Third Embodiment

A third embodiment will now be described.

Figure 11:
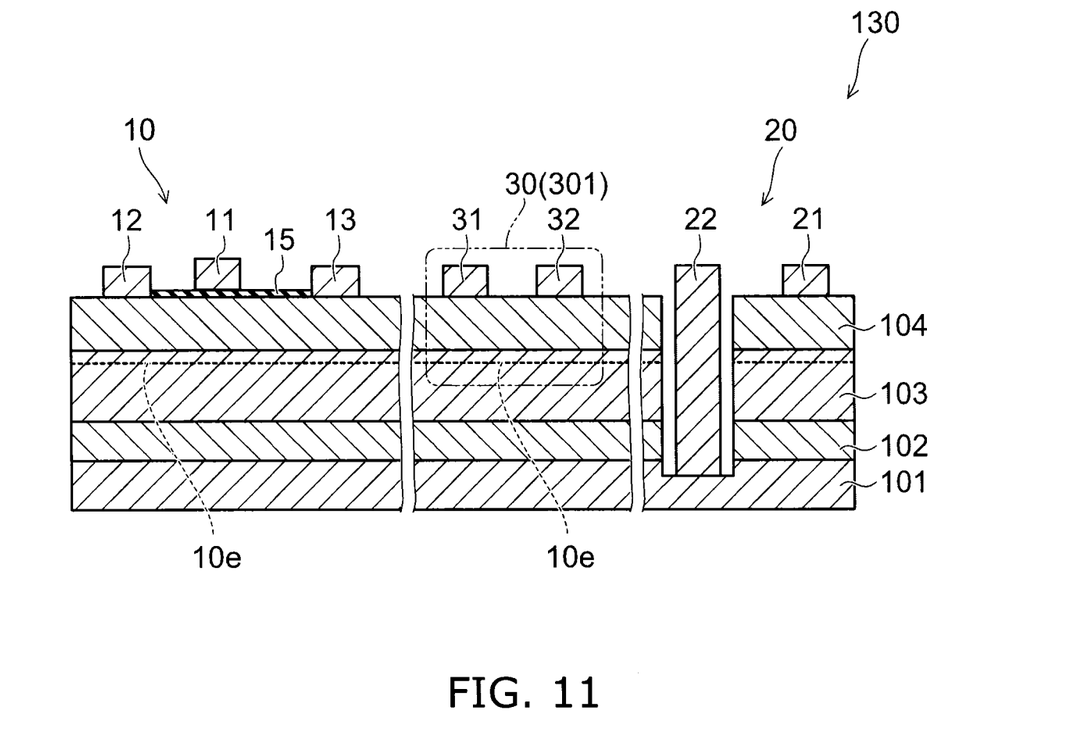
FIG. 11 is a schematic cross-sectional view showing the configuration of a semiconductor device according to the third embodiment.

FIG. 11 is a schematic cross-sectional view showing the configuration of a semiconductor device according to the third embodiment.

As shown in FIG. 11, the semiconductor device 130 according to the third embodiment includes the transistor 10, the diode 20, and the resistor 30. The transistor 10, the diode 20, and the resistor 30 are provided in one chip.

The semiconductor device 130 includes the first substrate 101, the buffer layer 102 provided on the substrate 101, the GaN-containing layer 103 provided on the buffer layer 102, and the barrier layer 104 that is provided on the GaN-containing layer 103 and has a heterojunction with the GaN-containing layer 103.

The transistor 10 includes the gate electrode 11, the source electrode 12, and the drain electrode 13 that are provided on the barrier layer 104. The source electrode 12 is separated from the drain electrode 13. The gate electrode 11 is provided between the source electrode 12 and the drain electrode 13. The gate electrode 11 is provided on the barrier layer 104 with the gate insulating film 105 interposed.

The diode 20 includes the anode electrode 21 and the cathode electrode 22. The anode electrode 21 has a Schottky junction with the barrier layer 104. The cathode electrode 22 has an ohmic junction with the GaN-containing layer 103. The cathode electrode 22 is electrically connected to the source electrode 12.

The resistor 30 is provided between the gate electrode 11 and the anode electrode 21. In the example shown in FIG. 11, the resistor 301 that utilizes the electrical resistance of the two-dimensional electron gas 10e is used as the resistor 30. The other resistors 302 and 303 may be used as the resistor 30.

The transistor 10, the diode 20, and the resistor 30 are electrically connected by interconnects that are not shown in FIG. 11. In other words, the source electrode 12 of the transistor 10 is connected to the cathode electrode 22 of the diode 20. The gate electrode 11 of the transistor 10 is connected to the one end 31 of the resistor 30. The other end 32 of the resistor 30 is connected to the anode electrode 21 of the diode 20.

The semiconductor device 130 has an on-voltage that is equivalent to that of the diode 20 for the forward bias and a breakdown voltage that is equivalent to that of the transistor 10 for the reverse bias. In the semiconductor device 130, the oscillation of the signal output from the drain electrode 13 when the signal of the prescribed frequency is input to the anode electrode 21 is suppressed. In the semiconductor device 130, the rectifying circuit 110 is included in one chip. Accordingly, the rectifying circuit 110 can be downsized.

Fourth Embodiment

A fourth embodiment will now be described.

Figure 12A:
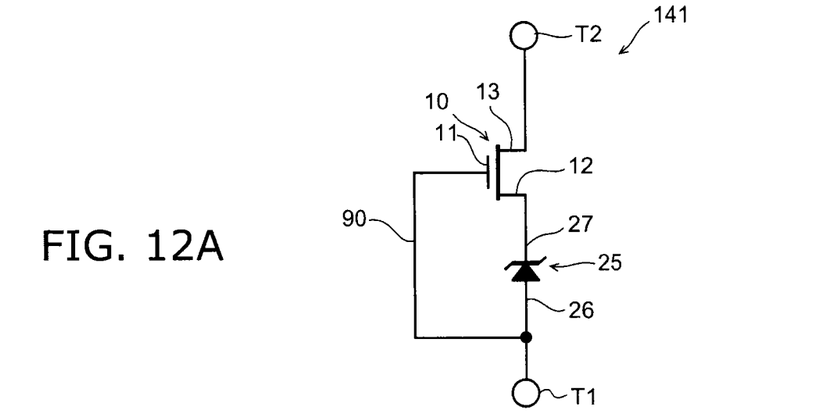
FIGS. 12A to 12C are circuit diagrams showing configurations of rectifying circuits according to the fourth embodiment.
Figure 12B:
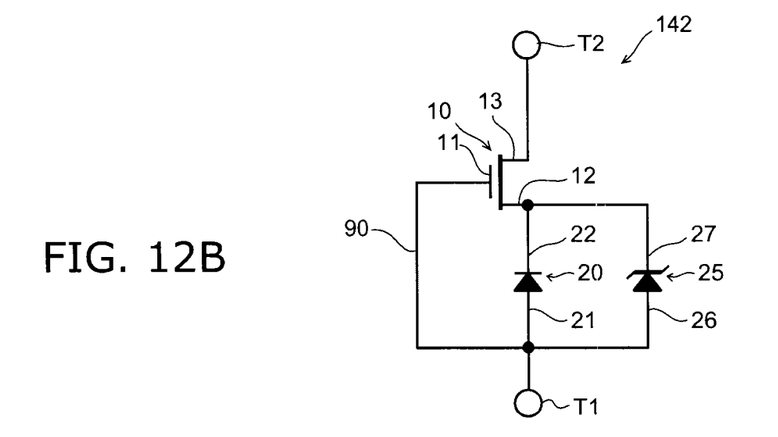
Figure 12C:
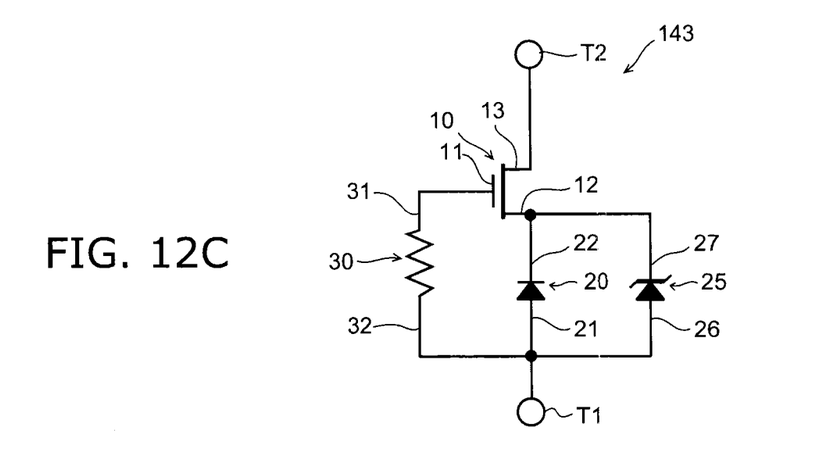

FIG. 12A to FIG. 12C are circuit diagrams showing configurations of rectifying circuits according to the fourth embodiment.

FIG. 12A shows a rectifying circuit 141; FIG. 12B shows a rectifying circuit 142; and FIG. 12C shows a rectifying circuit 143.

The rectifying circuit 141 shown in FIG. 12A includes the first terminal T1, the second terminal T2, the transistor 10, a Zener diode (a rectifying element) 25, and an interconnect 90. The Zener diode 25 includes an anode electrode 26 and a cathode electrode 27. The anode electrode 26 of the Zener diode 25 is connected to the first terminal T1. The cathode electrode 27 of the Zener diode 25 is connected to the source electrode 12 of the transistor 10. One end of the interconnect 90 is electrically connected to the gate electrode 11 of the transistor 10; and the other end of the interconnect 90 is electrically connected to an anode electrode 26.

The rectifying circuit 142 shown in FIG. 12B includes the first terminal T1, the second terminal T2, the transistor 10, the Zener diode 25, the diode 20 which is a diode other than a Zener diode, and the interconnect 90. An anode electrode 26 of the Zener diode 25 is connected to the first terminal T1. A cathode electrode 27 of the Zener diode 25 is connected to the source electrode 12 of the transistor 10. The Zener diode 25 is connected in parallel with the diode 20.

The rectifying circuit 143 shown in FIG. 12C includes the first terminal T1, the second terminal T2, the transistor 10, the Zener diode 25, the diode 20 which is a diode other than a Zener diode, and the resistor 30.

Operations of the rectifying circuits 141, 142, and 143 will now be described.

The diode 20 and the Zener diode 25 are called rectifying elements when described below without differentiating between the diode 20 and the Zener diode 25.

First, the operation when a forward bias is applied to the rectifying circuits 141, 142, and 143 will be described. The rectifying element is switched to a forward bias state when a voltage that is higher than that of the second terminal T2 (a voltage that is not less than the on-voltage of the rectifying element) is applied to the first terminal T1. At this time, a positive potential is applied to the gate electrode 11 of the transistor 10. The threshold voltage of the transistor 10 is lower than the on-voltage of the rectifying element (e.g., is normally on). Therefore, the transistor 10 is in the on-state when the voltage that is not less than the on-voltage of the rectifying element is applied to the gate electrode 11. Thereby, a current flows in the transistor 10 from the rectifying element. In other words, for the forward bias, the rectifying circuits 141, 142, and 143 operate at an on-voltage that is equivalent to the on-voltage of the rectifying element.

The operation when a reverse bias is applied to the rectifying circuits 141, 142, and 143 will now be described.

The rectifying element is switched to a reverse bias state when a voltage that is lower than that of the second terminal T2 (a voltage that is less than the on-voltage of the rectifying element) is applied to the first terminal T1. Thereby, the voltage of the gate electrode 11 decreases as the voltage of the rectifying element increases. The transistor 10 is switched to the off-state when the voltage of the gate electrode 11 falls below the threshold. Thereby, the current that was flowing in the transistor 10 from the rectifying element is interrupted.

There is a possibility that overvoltage may occur in the source electrode 12 in the off-state of the reverse bias or the transient response of the rectifying circuits 141, 142, and 143. This is because, when the rectifying element is switched off and the transistor 10 is switched off, the rectifying element and the transistor 10 can be considered to be an equivalent circuit in which the parasitic capacitances of the rectifying element and the transistor 10 are connected in series. Therefore, there is a possibility that overvoltage corresponding to the division ratio of the parasitic capacitances may occur in the source electrode 12 when a voltage having a large amplitude is applied to the second terminal T2. In such a case, there is a possibility that breakdown of the rectifying element and/or the transistor 10 may occur.

In the case where there is a Zener diode 25 such as in the rectifying circuits 141, 142, and 143, the breakdown voltage can be obtained without such a breakdown phenomenon occurring because clipping occurs at the Zener voltage. It is necessary to select a Zener voltage that is not more than the gate breakdown voltage of the transistor 10.

There is a possibility that overvoltage may occur even when the leak current of the transistor 10 is larger than the leak current of the rectifying element. In such a case, the transistor 10 and the rectifying element can be considered to be a circuit in which the leak resistances of the transistor 10 and the rectifying element are connected in series; and a voltage is produced in the source electrode 12 according to the division ratio of the resistances. Therefore, there is a possibility that breakdown of the rectifying circuits 141, 142, and 143 may occur when the leak current of the transistor 10 is large. In such a case as well, such a breakdown phenomenon can be avoided beforehand by including a Zener diode 25 such as in the rectifying circuits 141, 142, and 143.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$) and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Although examples are described in the embodiments described above in which the transistor 10 has a planar gate structure, the embodiments are practicable even in the case where the transistor 10 has a trench gate structure. Other than GaN, the transistor 10 may include at least one selected from Si, SiC, diamond, ZnO, and InGaN.

As described above, according to the rectifying circuit and the semiconductor device according to the embodiments, the characteristics such as the breakdown voltage, etc., can be improved.

Hereinabove, embodiments are described with reference to specific examples. However, the embodiments are not limited to these specific examples. In other words, appropriate design modifications made to the specific examples by one skilled in the art are included in the scope of the embodiment to the extent that the features of the embodiments are included. The components included in the specific examples described above and the dispositions, materials, conditions, configurations, sizes, etc., of the components are not limited to those illustrated and may be modified appropriately.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A rectifying circuit, comprising:
   a transistor including a control electrode, a first electrode, and a second electrode;
   a rectifying element including an anode electrode and a cathode electrode, the cathode electrode being electrically connected to the first electrode; and
   a resistor, one end of the resistor being electrically connected to the control electrode, one other end of the resistor being electrically connected to the anode electrode;
   a capacitor and another resistor connected in parallel with the resistor;
   a first terminal electrically connected to the anode electrode, and a first signal being capable of being input to the first terminal; and
   a second terminal electrically connected to the second electrode, and a second signal being capable of being output from the second terminal,
   a threshold voltage of the transistor being lower than an on-voltage of the rectifying element.

2. The circuit according to claim 1, wherein the transistor is in an on-state when an on-voltage of the rectifying element s applied between the control electrode and the first electrode.

3. The circuit according to claim 1, wherein the transistor includes a nitride semiconductor.

4. The circuit according to claim 1, wherein the transistor is a field effect transistor.

5. The circuit according to claim 1, wherein the rectifying element is a Schottky barrier diode.

6. The circuit according to claim 1, wherein the rectifying element is a Zener diode.

7. The circuit according to claim 1, wherein the rectifying element includes a Schottky barrier diode, and a Zener diode connected in parallel with the Schottky barrier diode.

8. The circuit according to claim 1, wherein the rectifying element includes silicon.

9. The circuit according to claim 1, wherein a breakdown voltage of the rectifying element is lower than a breakdown voltage of the transistor and higher than the absolute value of a threshold voltage of the transistor.

10. The circuit according to claim 1, wherein a breakdown voltage of the transistor is higher than the absolute value of a voltage applied to the rectifying element when a reverse bias is applied to the rectifying element.

11. The circuit according to claim 1, wherein a resistance value of the resistor is not less than 9 ohms and not more than 200 ohms in the case where a rated current of the rectifying circuit is not more than 1 ampere.

12. The circuit according to claim 1, wherein a resistance value of the resistor is not less than 4 ohms and not more than 100 ohms in the case where a rated current of the rectifying circuit is not less than 1 ampere and not more than 5 amperes.

13. The circuit according to claim 1, wherein a resistance value of the resistor is not less than 2 ohms and not more than 50 ohms in the case where a rated. current of the rectifying circuit is not less than 5 ampere and not more than 10 amperes.

14. The circuit according to claim 1, wherein a resistance value of the resistor is not less than 1 ohms and not more than 10 ohms in the case where a rated current of the rectifying circuit is not less than 10 ampere and not more than 50 amperes.

15. The circuit according to claim 1, wherein
   the resistor is a portion of an interconnect connecting the control electrode and the anode electrode, and
   a resistance value of the resistor is set by at least one selected from a length, a diameter, and a material of the portion of the interconnect.

* * * * *